(12) United States Patent
Kim et al.

(10) Patent No.: US 9,685,464 B2
(45) Date of Patent: Jun. 20, 2017

(54) DISPLAY SUBSTRATE AND METHOD OF MANUFACTURING MOTHER SUBSTRATE FOR DISPLAY SUBSTRATE

(71) Applicant: Samsung Display Co., Ltd., Yongin (KR)

(72) Inventors: Dae-Suk Kim, Seongnam-si (KR); Dong-Yeon Son, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/332,118

(22) Filed: Jul. 15, 2014

(65) Prior Publication Data

US 2015/0214245 A1 Jul. 30, 2015

(30) Foreign Application Priority Data

Jan. 27, 2014 (KR) .................. 10-2014-0009673

(51) Int. Cl.
*H01L 23/58* (2006.01)
*H01L 27/12* (2006.01)
*H01L 21/66* (2006.01)
*G09G 3/00* (2006.01)

(52) U.S. Cl.
CPC ........... *H01L 27/124* (2013.01); *G09G 3/006* (2013.01); *H01L 22/32* (2013.01); *G09G 2330/04* (2013.01)

(58) Field of Classification Search
CPC .................................................. H01L 27/124
See application file for complete search history.

(56) References Cited

U.S. PATENT DOCUMENTS

| 6,392,622 | B1 | 5/2002 | Ozawa |
| 2008/0074137 | A1* | 3/2008 | Kim ................ G02F 1/13458 324/750.3 |
| 2008/0117199 | A1 | 5/2008 | Shie |

(Continued)

FOREIGN PATENT DOCUMENTS

| JP | 07318879 | 12/1995 |
| JP | 2002040454 | 2/2002 |

(Continued)

*Primary Examiner* — Marc Armand
*Assistant Examiner* — Sarah Salerno
(74) *Attorney, Agent, or Firm* — H.C. Park & Associates, PLC

(57) ABSTRACT

A display substrate includes a pixel portion, a test pad portion and a first electrostatic dispersion line. The pixel portion includes a switching element, a first electrode and a second electrode. The switching element is disposed in a display area of a base substrate. The switching element is electrically connected with a gate line and a data line. The first electrode is disposed adjacent to the switching element. The second electrode is disposed on the first electrode and overlaps the first electrode. The first electrode and the second electrode are electrically connected with the switching element. The test pad portion is disposed adjacent to the display area. The test pad portion is electrically connected with the pixel portion to apply a test signal. The electrostatic dispersion line extends to an end of the base substrate. The first electrostatic dispersion line and the second electrode are formed from a same layer.

9 Claims, 14 Drawing Sheets

(56) References Cited

U.S. PATENT DOCUMENTS

| | | | |
|---|---|---|---|
| 2009/0086143 A1* | 4/2009 | Kaneko | G02F 1/136204 349/139 |
| 2012/0074420 A1* | 3/2012 | Park | H01L 27/3246 257/72 |
| 2012/0171793 A1* | 7/2012 | Lee | H01L 27/1288 438/34 |

FOREIGN PATENT DOCUMENTS

| | | |
|---|---|---|
| JP | 2009069725 | 4/2009 |
| JP | 2013164593 | 8/2013 |
| KR | 1020030021384 | 3/2003 |
| KR | 10-0749482 | 8/2007 |
| KR | 1020080020168 | 3/2008 |
| KR | 1020120075114 | 7/2012 |
| KR | 1020130048434 | 5/2013 |

* cited by examiner

DISPLAY SUBSTRATE AND METHOD OF MANUFACTURING MOTHER SUBSTRATE FOR DISPLAY SUBSTRATE

CROSS REFERENCE TO RELATED APPLICATION

This application claims priority from and the benefit of Korean Patent Application No. 10-2014-0009673, filed on Jan. 27, 2014, in the Korean Intellectual Property Office KIPO, which is hereby incorporated by reference for all purposes as if fully set forth herein.

BACKGROUND

Field

Exemplary embodiments of the present inventive concept relate to a display apparatus and method of manufacturing mother substrate for display substrate. More specifically, exemplary embodiments relate to a display apparatus capable of decreasing static electricity, and method of manufacturing mother substrate for the display substrate.

Discussion of the Background

Recently, liquid display apparatuses having light weight and small size have been manufactured. Previously, cathode ray tube (CRT) display apparatuses have been used due to performance and competitive pricing. However, the CRT display apparatuses have a weakness, since they are large in size and have poor portability. Therefore, the liquid display apparatus has been highly regarded due to small size, light weight, and low power consumption.

Generally, a liquid crystal display (LCD) panel may include a thin film transistor (TFT) substrate, an opposing substrate and a liquid crystal (LC) layer. The TFT substrate may include a plurality of gate lines, a plurality of data lines crossing the gate lines, a plurality of TFTs connected to the gate lines and data lines, and a plurality of pixel electrodes connected to the TFTs. The TFT may include a gate electrode extending from the gate line, a source electrode extending to the data line, and a drain electrode spaced apart from the source electrode.

An alignment layer may be formed on a display substrate. The alignment layer helps the LC layer have a directional nature. A process of forming of the alignment layer may include coating a polyimide or polymer on a substrate and rubbing. The rubbing may be performed by a drum to which a rubbing cloth is adhered, so that grooves having a certain direction may be formed.

In the process of rubbing, a static electricity may be generated by friction. The static electricity generated in the rubbing process may flow into metal lines formed on a display substrate. Accordingly, the metal lines may be damaged by the static electricity, so that a faulty display apparatus may be manufactured.

SUMMARY

Exemplary embodiments of the present inventive concept provide a display apparatus capable of decreasing static electricity. Exemplary embodiments of the present inventive concept further provide method of manufacturing mother substrate for the display substrate.

In an exemplary embodiment of a display substrate according to the present inventive concept, the display substrate includes a pixel portion, a test pad portion and a first electrostatic dispersion line. The pixel portion includes a switching element, a first electrode and a second electrode. The switching element is disposed in a display area of a base substrate. The switching element is electrically connected with a gate line and a data line. The first electrode is disposed adjacent to the switching element. The second electrode is disposed on the first electrode to be overlapped with the first electrode. The first electrode and the second electrode are electrically connected with the switching element. The test pad portion is disposed adjacent to the display area. The test pad portion is electrically connected with the pixel portion to apply a test signal. The electrostatic dispersion line is extending to an end of the base substrate. The first electrostatic dispersion line and the second electrode are formed from a same layer.

In an exemplary embodiment of a method of manufacturing a mother substrate for a display substrate according to the present inventive concept, the method includes forming an array layer, forming a first electrode on the base mother substrate on which the array layer is formed, forming a transparent electrode layer on the base mother substrate on which the first electrode is formed and patterning the transparent electrode layer to form a transparent electrode pattern, the transparent electrode pattern. The array layer includes a metal line formed on a display area of each of array regions of a base mother substrate, a test signal line formed in a peripheral area of each of the array regions and electrically connected with the metal line, and a test switching portion electrically connected with the test signal line. The transparent electrode pattern includes a second electrode overlapped with the first electrode, a shorting bar formed between adjacent array regions, a test pad electrode disposed at an end of the test signal line and a first electrostatic dispersion line connecting between the test pad electrode and the shorting bar.

According to the exemplary embodiments of the present inventive concept as explained above, a pad portion and a shorting bar are electrically connected with each other through electrostatic dispersion lines. Thus, charges flowing through the pad portion may be dispersed into the overall mother substrate for a display substrate by using the shorting bar. Therefore, concentration of the charges on a portion of the mother substrate may be prevented. In this manner, static electricity may be prevented or reduced.

In addition, a ground electrode connected with the shorting bar is formed, so that charges generated in a manufacturing process to the mother substrate may be dispersed immediately. Thus, damages due to the static electricity may be prevented and a reliability of product and manufacturing process may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

The above and other features and advantages of the present inventive concept will become more apparent by describing in detailed exemplary embodiments thereof with reference to the accompanying drawings.

DETAILED DESCRIPTION OF THE ILLUSTRATED EMBODIMENTS

Figure 1:
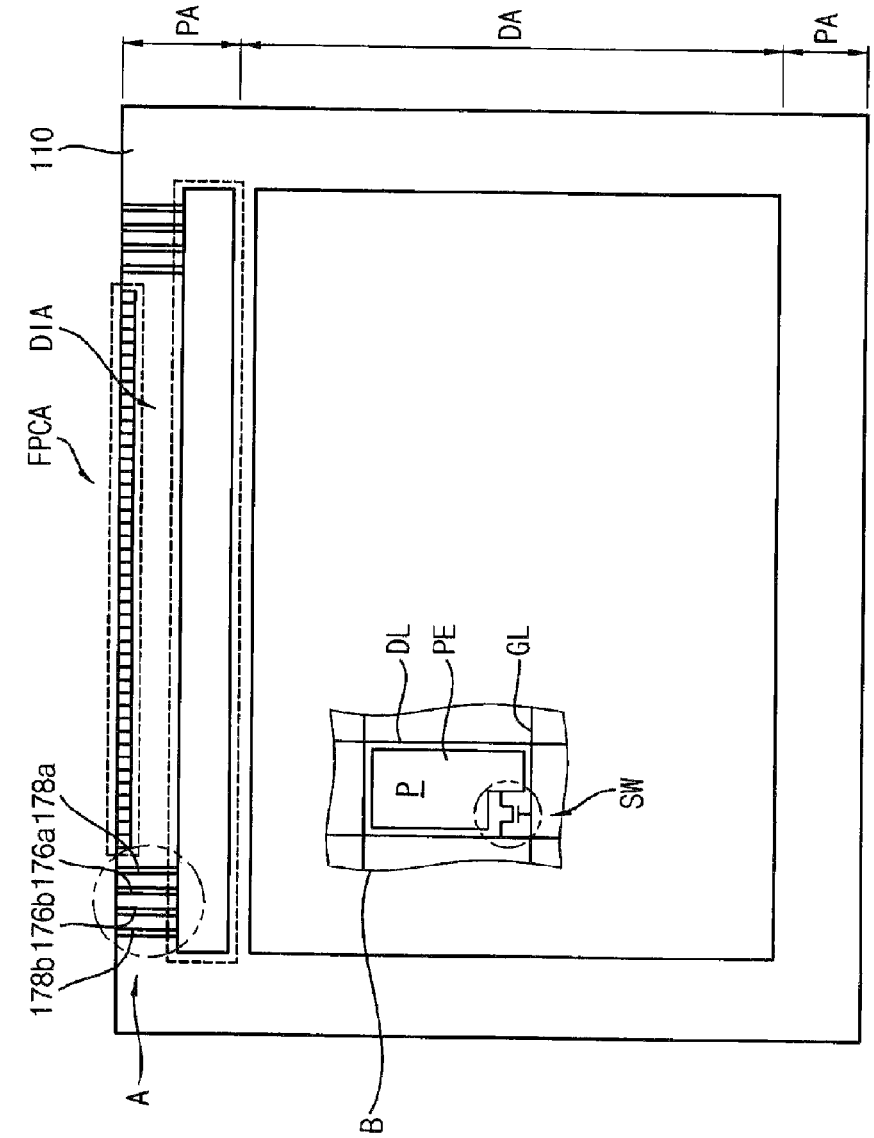
FIG. 1 is a plan view illustrating an exemplary embodiment of a display substrate according to the inventive concept.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
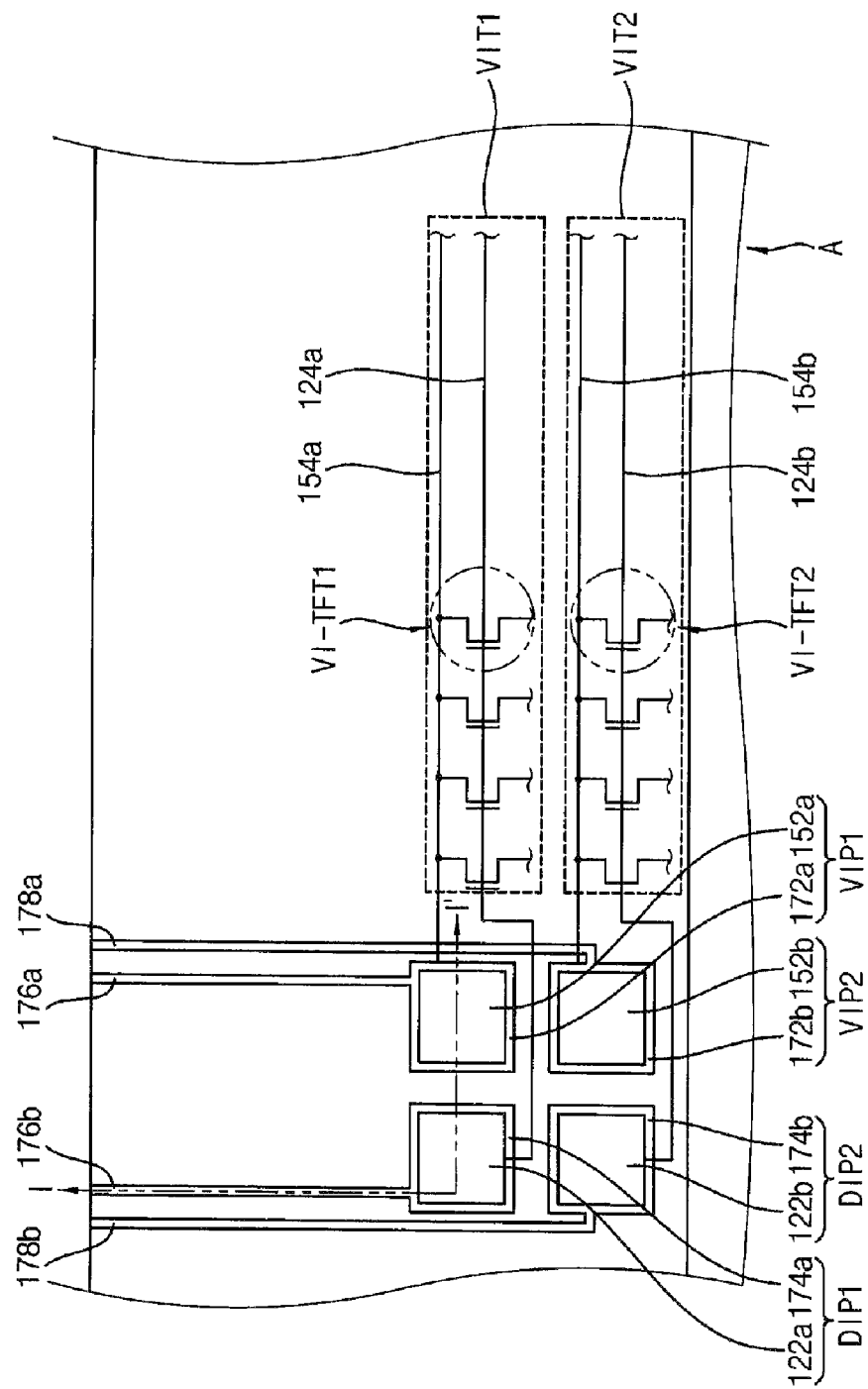
FIG. 2 is a plan view magnifying portion "A" of FIG. 1.
Figure 3:
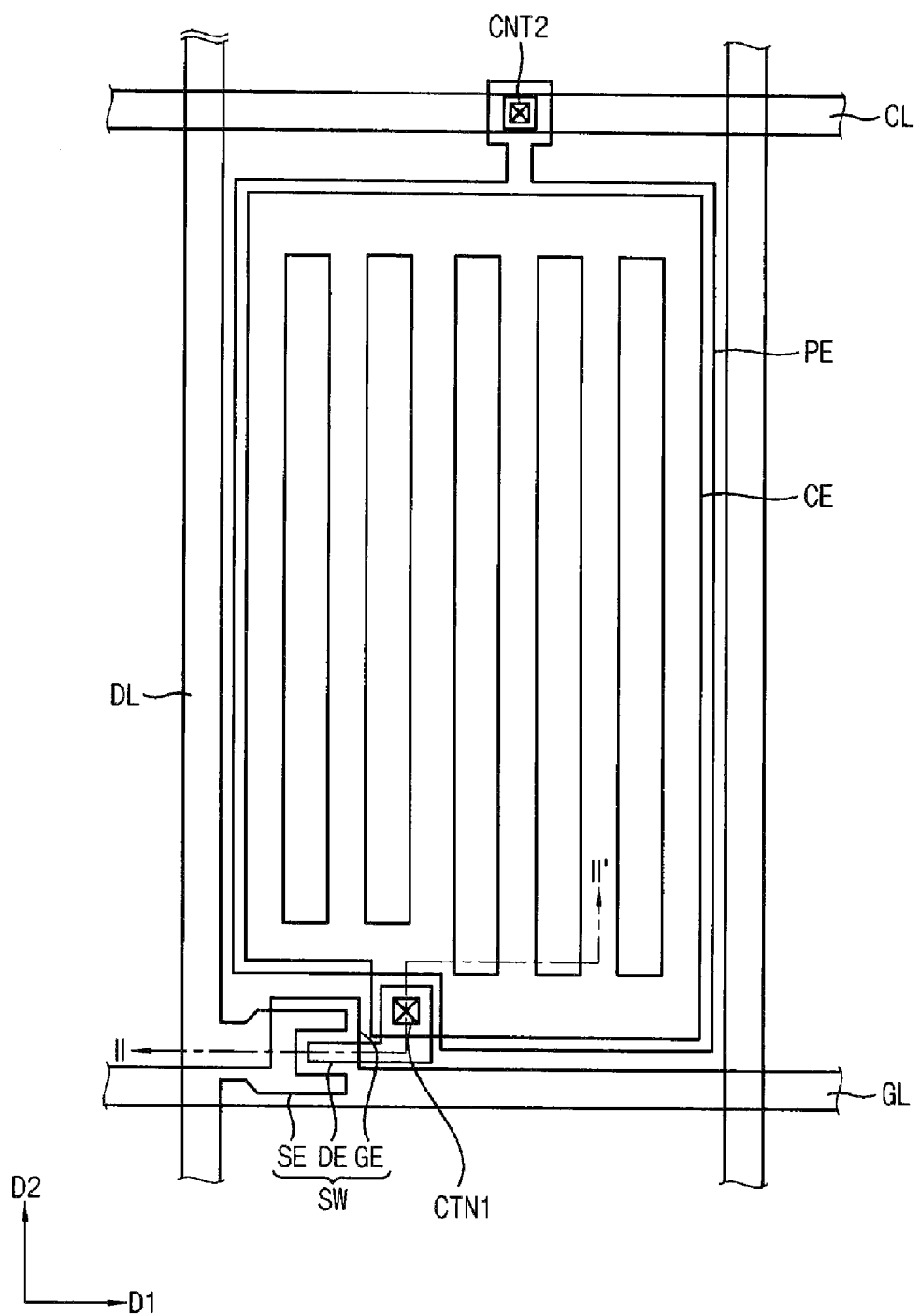
FIG. 3 is a plan view magnifying portion "B" of FIG. 1.
Figure 4:
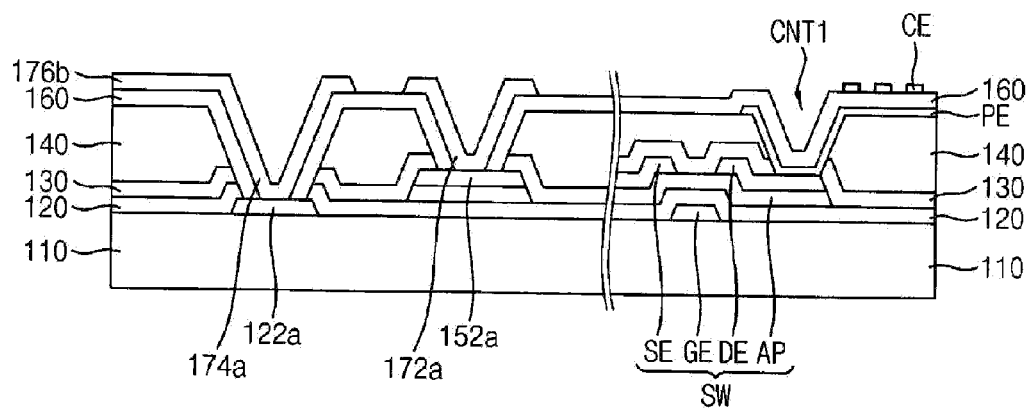
FIG. 4 is a cross-sectional view taken along line I-I' of FIG. 2 and line II-II' of FIG. 3.

FIG. 1 is a plan view illustrating an exemplary embodiment of a display substrate according to the inventive concept. FIG. 2 is a plan view magnifying portion "A" of FIG. 1. FIG. 3 is a plan view magnifying portion "B" of FIG. 1. FIG. 4 is a cross-sectional view taken along line I-I' of FIG. 2 and line II-II' of FIG. 3.

Referring to FIGS. 1 to 4, a base substrate 110 of a display substrate 100 according to an exemplary embodiment of the present inventive concept includes a display area DA including a pixel area P and a peripheral area PA surrounding the display area DA. The peripheral area PA may include a driving chip mounting area DIA and a flexible printed circuit (FPC) connection area FPCA.

A gate line GL, a data line DL, a pixel switching element SW and a pixel electrode PE are formed in the display area DA. The display substrate 100 includes a base substrate 110, a gate electrode GE, source electrode SE, a drain electrode DE, an active pattern AP, a pixel electrode PE, a common electrode CE, a gate insulation layer 120, a first passivation layer 130, an organic layer 140 and a second passivation layer 160.

Examples of the base substrate 110 may include a glass substrate, a quartz substrate, a silicon substrate, a plastic substrate or the like.

The gate electrode GE is disposed on the base substrate 110. The gate electrode GE may have a single layer structure including copper (Cu), silver (Ag), chrome (Cr), molybdenum (Mo), aluminum (Al), titanium (Ti), manganese (Mn), or an alloy thereof. In an exemplary embodiment, the gate electrode GE may have a multi-layer structure having a plurality of layers that may include materials different each other. For example, the gate electrode GE may include a copper layer and a titanium layer disposed on or under the copper layer.

The gate insulation layer 120 is formed on the gate electrode GE. The gate insulation layer 120 may cover the base substrate 110 and the gate electrode GE. The gate insulation layer 120 may include inorganic material such as silicon oxide (SiOx) and/or silicon nitride (SiNx). For example, the gate insulation layer 120 may include silicon oxide (SiOx), and may have a thickness of about 500 Å. In addition, the gate insulation layer 120 may include a plurality of layers including materials different each other.

An active pattern AP is formed on the gate insulation layer 120. The active pattern AP is formed on the gate insulation layer 120 in an area in which the gate electrode GE is formed. The active pattern AP may overlap with the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE. The source electrode SE and the drain electrode DE may be formed on the active pattern AP. The source electrode SE and the drain electrode DE may be spaced apart from each other. However, the above-described layering is merely exemplary and a person having skill in the art would appreciate alternative or additional layering schemes.

The source electrode SE and the drain electrode DE may have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The first passivation layer 130 may be formed on the source electrode SE and the drain electrode DE. The first passivation layer 130 may be formed with a material including silicon oxide (SiOx) or silicon nitride (SiNx).

The organic layer 140 is formed on the first passivation layer 130. The organic layer 140 planarizes an upper surface of the display substrate 100, so that problems due to the step, such as disconnection of a signal line, may be prevented.

The pixel electrode PE is formed on the organic layer 140. The pixel electrode PE may include a transparent conductive material, such as indium tin oxide (ITO), indium zinc oxide (IZO), etc. In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

The second passivation layer 160 may be formed on the pixel electrode PE. The second passivation layer 160 may be formed with a material including silicon oxide (SiOx) or silicon nitride (SiNx).

The common electrode CE may be formed on the second passivation layer 160. The common electrode CE may overlap the pixel electrode PE. The common electrode CE may include a transparent conductive material, such as indium tin oxide (ITO), indium zinc oxide (IZO) and etc. Additionally or alternatively, the common electrode CE may include titanium (Ti) and/or molybdenum titanium (MoTi). The common electrode CE may be electrically connected with the common line CL. The common electrode CE may be applied with a common voltage from the common line CL. The common electrode CE may be electrically connected with the common line CL through the second contact hole CNT2.

Integrated circuit (IC) pads (not shown) electrically connected with a driving chip (not shown), a test switching portion (not shown) for performing a VI process, a test signal line (not shown) connected with the test switching portion, and a driving signal line (not shown) may be formed in the driving chip mounting area DIA. FPC pads (not shown) electrically connected with metal terminals of a flexible printed circuit board (not shown) may be formed in the FPC connection area FPCA. First electrostatic dispersion lines 176a and 178a and second electrostatic lines 176b and 178b are formed in the peripheral area PA. The first electrostatic dispersion lines 176a and 178a extend from the driving chip mounting area DIA to an end of the base substrate 110. The second electrostatic dispersion lines 176b and 178b are substantially parallel with the first electrostatic lines 176a and 178a and extend to the end of the base substrate 110.

The first and second electrostatic dispersion lines 176a, 178a, 176b, and 178b are connected with a shorting bar (not shown) formed on a mother substrate for a display substrate. The first and second electrostatic dispersion lines 176a, 178a, 176b, and 178b may be separated from the shorting bar to remain in the display substrate by a process of cutting the mother substrate. Third electrostatic dispersion lines (not shown) connected with the FPC pads may be formed in the FPC connection area FPCA. The third electrostatic dispersion lines may be connected with the shorting bar with the first and second electrostatic dispersion lines 176a, 178a, 176b, and 178b. The third electrostatic dispersion lines may be separated from the shorting bar to remain in the display substrate by the process of cutting the mother substrate. The first electrostatic dispersion lines 176a and 178a, the second electrostatic dispersion lines 176b and 178b, and the common electrode CE may be formed from a same layer.

A first test switching portion VIT1, a second test switching portion VIT2, a first test signal line 154a, a second test signal line 154b, a first driving signal line 124a, a second driving signal line 124b, a first test pad portion VIP1, a second test pad portion VIP2, a first driving pad portion DIP 1, and a second driving pad portion DIP2 are formed in the driving chip mounting area DIA. The first electrostatic dispersion lines 176a and 178a are respectively connected with the first test pad portion VIP1 and the second test pad portion VIP2. The second electrostatic dispersion lines 176b and 178b are respectively connected with the first driving pad portion DIPJ and the second driving pad portion DIP2.

The first test switching portion VIT1 includes first test switching elements VI-TFT1 connected with the first test signal line 154a and the first driving signal line 124a. The second test switching portion VIT2 includes second test switching elements VI-TFT2 connected with the second test signal line 154b and the second driving signal line 124b. The first test switching element VI-TFT1 includes a gate electrode, a source electrode formed on the gate electrode and a drain electrode formed on the gate electrode.

The first test pad portion VIP1 is connected with an end of the first test signal line 154a. The first test pad portion VIP1 includes a first test electrode 152a and a first test pad electrode 172a. The first test electrode 152a is connected with the first test signal line 154a. The test pad electrode 172a is electrically connected with the first test electrode 152a. The first test pad electrode 172a is connected with the first electrostatic dispersion lines 176a. The second test pad portion VIP2 is connected with an end of the second test signal line 154b. The second test pad portion VIP2 includes a second test electrode 152b and a second test pad electrode 172b. The second test electrode 152b is connected with the second test signal line 154b. The second test pad electrode 172b is electrically connected with the second test electrode 152b. The second test pad electrode 172b is connected with the first electrostatic dispersion lines 178a.

The first driving pad portion DIP1 is connected with an end of the first driving signal line 124a. The first driving pad portion DIP1 includes a first driving electrode 122a and a first driving pad electrode 174a. The first driving electrode 122a is connected with the first driving signal line 124a. The first driving pad electrode 174a is electrically connected with the first driving electrode 122a. The first driving pad electrode 174a is connected with the second electrostatic dispersion lines 176b. The second driving pad portion DIP2 is connected with an end of the second driving signal line 124b. The second driving pad portion DIP2 includes a second driving electrode 122b and a second driving pad electrode 174b. The second driving electrode 122b is connected with the second driving signal line 124b. The second driving pad electrode 174b is electrically connected with the second driving electrode 122b. The second driving pad electrode 174b is connected with the second electrostatic dispersion lines 178a.

Figure 5:
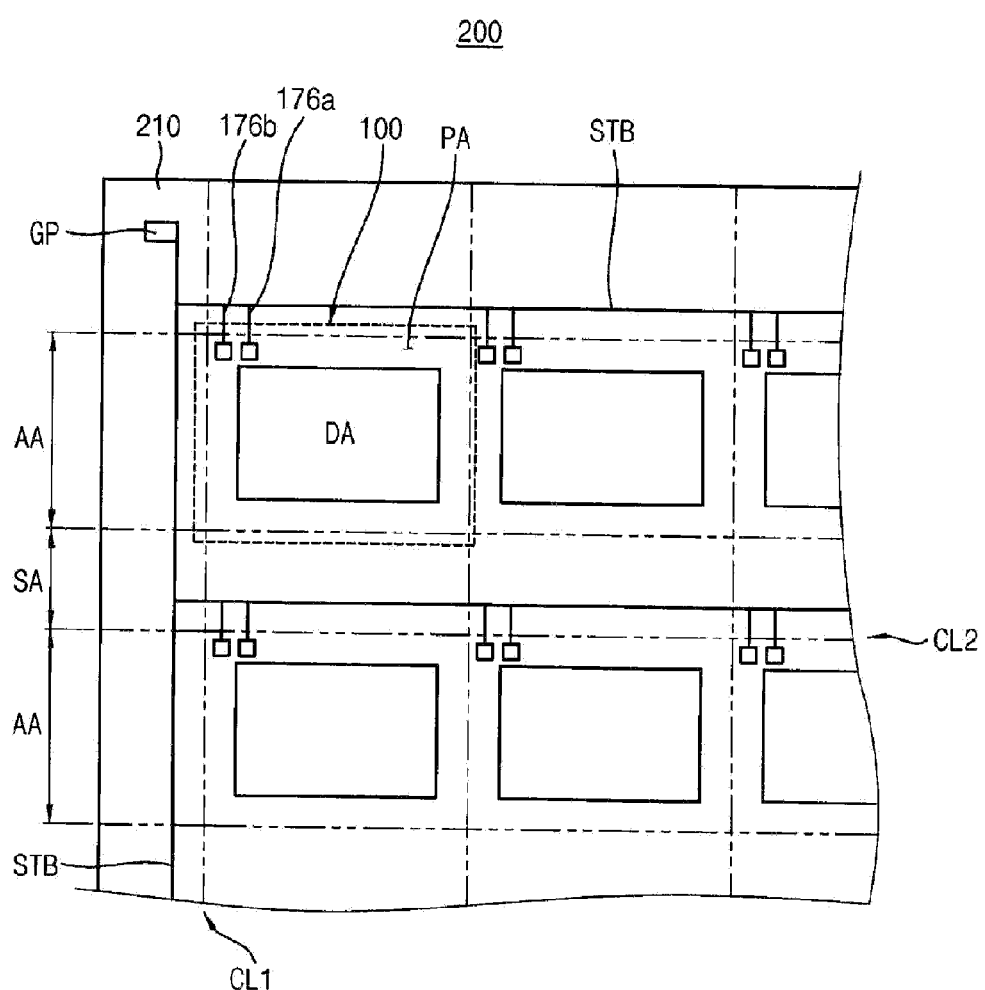
FIG. 5 is a plan view illustrating an exemplary embodiment of a mother substrate according to the inventive concept.

FIG. 5 is a plan view illustrating an exemplary embodiment of a mother substrate according to the inventive concept.

Referring to FIG. 5, a mother substrate 200 for a display substrate includes a base mother substrate 210. The base mother substrate 210 includes a plurality of array areas AA and a plurality of outer areas SA. An array layer is formed in the array area AA. The outer area SA is formed between adjacent array areas AA. An array layer is formed in the array area AA. The outer area SA is formed between adjacent array areas AA. Each of the array areas AA includes at least one display area DA and at least one peripheral area PA. An image is displayed in the display area DA. The peripheral area PA surrounds the display area DA. The array layer may include a gate line (not shown), a data line, test signal lines, and driving signal lines. The gate line and the data line may be formed in the display area DA. The data line may cross with the gate line. The display area DA includes a plurality of pixel regions. The test signal lines and the driving signal lines may be formed in the peripheral area PA.

The base mother substrate 210 includes a shorting bar STB and a ground electrode GP. The shorting bar STB surrounds each of the array areas AA. The ground electrode GP is electrically connected with the shorting bar STB. The shorting bar STB is respectively connected with the first test electrode 152a and the first driving electrode 122a through the first electrostatic dispersion lines 176a and the second electrostatic dispersion lines 176b. The ground electrode GP may diffuse an electric charge generated during a manufacturing process to the mother substrate 200. The ground electrode GP may be disposed in the outer area SA, and may have a size of 5 mm×5 mm, however, these are merely exemplary, and a person having skill in the art would appreciate alternative positions and sizes for ground electrode GP.

The base mother substrate 210 is cut to form a plurality of display substrates 100 corresponding to the array areas AA through a process of cutting the base mother substrate by an array area AA. The base mother substrate 210 includes a first cutting line CL1 and a second cutting line CL2. The first cutting line CL1 is extending in the first direction. The second cutting line CL2 extends in a second direction substantially perpendicular to the first direction. The mother substrate 200 for a display substrate is cut along the first and second cutting lines CL1 and CL2, which are virtual lines.

FIGS. 6 to 10 are cross-sectional views illustrating an exemplary embodiment of a method of manufacturing the display substrate of FIG. 4.

Figure 6:
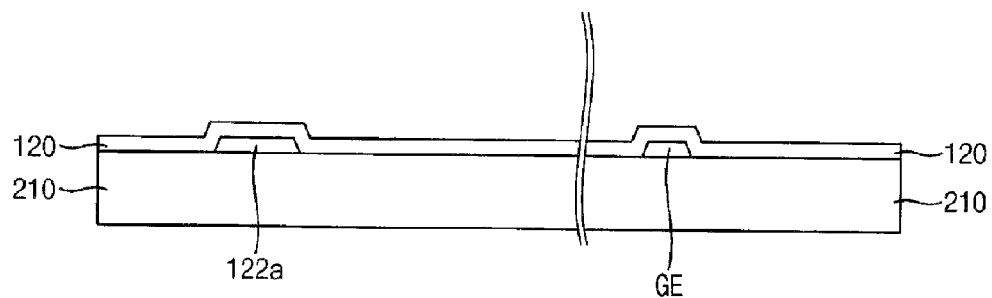
FIGS. 6, 7, 8, 9, and 10 are cross-sectional views illustrating an exemplary embodiment of a method of manufacturing the display substrate of FIG. 4.

Referring to FIG. 6, a gate electrode GE, a first driving electrode 122a and a gate insulation layer 120 are formed on a base mother substrate 210.

Examples of the base mother substrate 210 may include a glass substrate, a quartz substrate, a silicon substrate, a plastic substrate or the like. The gate electrode GE and the first driving electrode 122a may have a single layer structure including copper (Cu), silver (Ag), chrome (Cr), molybdenum (Mo), aluminum (Al), titanium (Ti), manganese (Mn), and/or a mixture thereof. Additionally or alternatively, the first conductive layer may have a multi layer structure having a plurality of layers including materials different each other.

The gate insulation layer 120 may be formed on the base mother substrate 210 on which the gate electrode GE and the first driving electrode 122a are formed. The gate insulation layer 120 may include inorganic material such as silicon oxide (SiOx) and/or silicon nitride (SiNx).

Figure 7:
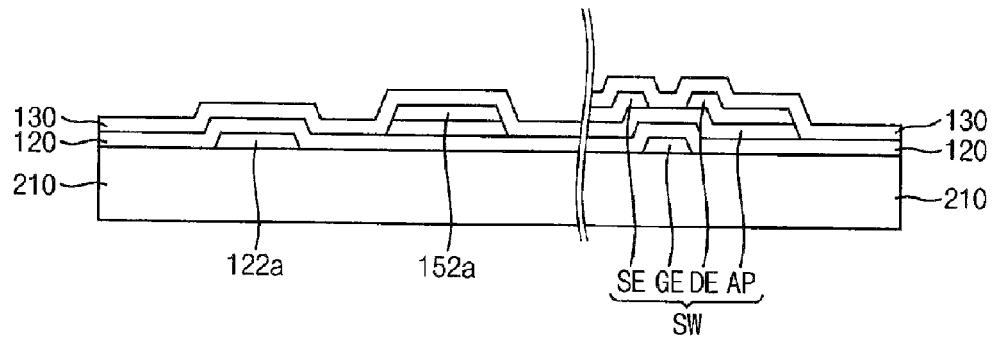

Referring to FIG. 7, an active pattern AP, a source electrode SE, a drain electrode DE, a first test electrode 152a and a first passivation layer 130 are formed on the base mother substrate 210 on which the first driving electrode 122a is formed.

The active pattern AP is formed on the gate insulation layer 120. The active pattern AP is formed on the gate insulation layer 120 in an area in which the gate electrode GE is formed. The active pattern AP may overlap the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE.

The source electrode SE and the drain electrode DE may have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The first passivation layer 130 may include the same material as the gate insulation layer 120. For example, the first passivation layer 130 may be formed with a material including silicon oxide (SiOx) or silicon nitride (SiNx).

Figure 8:
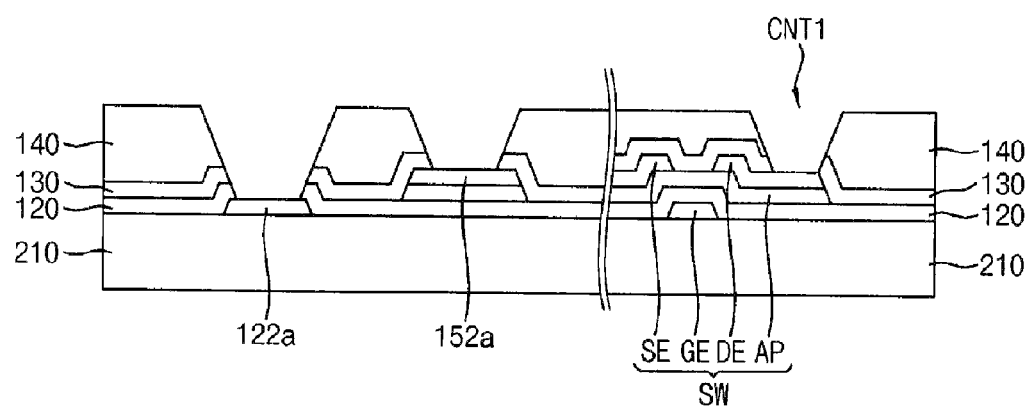

Referring to FIG. 8, an organic layer 140 is formed on the base mother substrate 210 on which the first passivation layer 130 is formed. The organic layer 140 planarizes an upper surface of the display substrate, so that problems due to the step, such as disconnection of a signal line, may be prevented.

Thereafter, the organic layer 140 is patterned to form a first contact hole CNT1. In addition, the organic layer 140, the first passivation layer 130 and the gate insulation layer 120 are patterned to expose a portion of the first driving electrode 122a. The organic layer 140 and the first passivation layer 130 are patterned to expose a portion of the first test electrode 152a.

Figure 9:
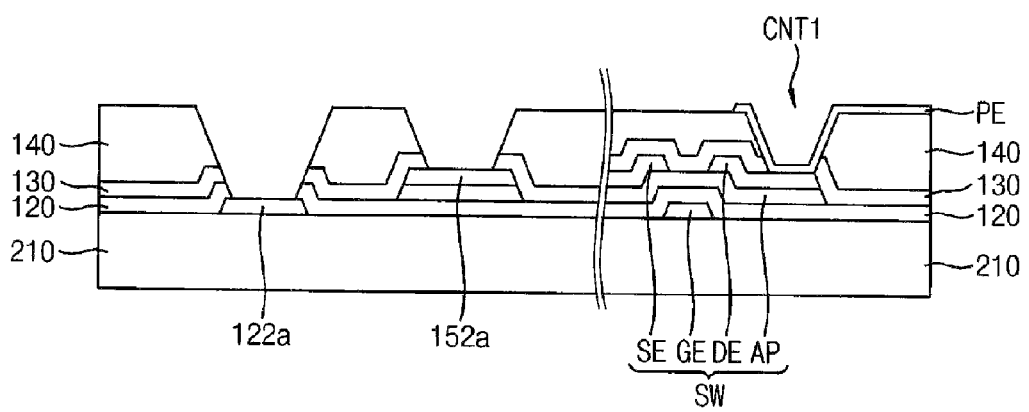

Referring to FIG. 9, a pixel electrode PE is formed on the base mother substrate 210 on which the first contact hole CNT1 is formed.

The pixel electrode PE may be electrically connected with the drain electrode DE through the first contact hole CNT1. The pixel electrode PE may include a transparent conductive material, such as indium tin oxide (ITO), indium zinc oxide (IZO), etc. In addition, the pixel electrode PE may include titanium (Ti) and/or molybdenum titanium (MoTi). The pixel electrode PE may be electrically connected with the drain electrode DE.

Figure 10:
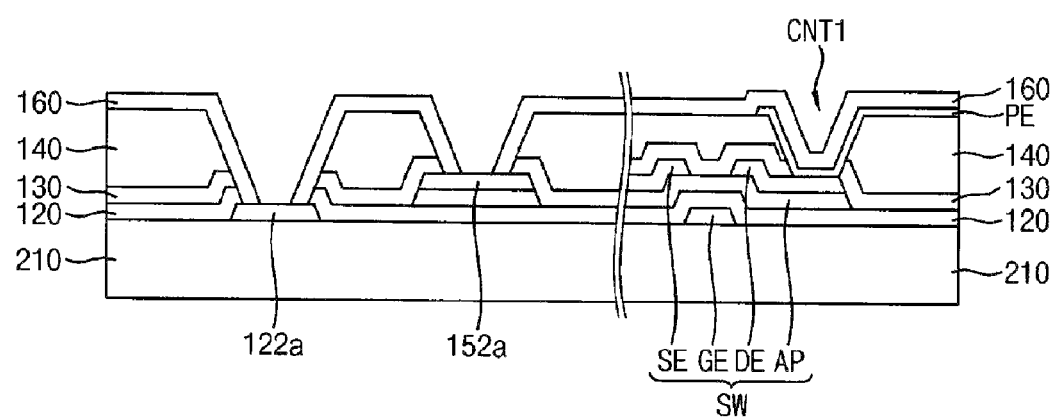

Referring to FIG. 10, a second passivation layer 160 is formed on the base mother substrate 210 on which the pixel electrode PE is formed. The second passivation layer 160 may include the same material as the first passivation layer 130. For example, the second passivation layer 160 may be formed with a material including silicon oxide (SiOx) or silicon nitride (SiNx).

Thereafter, and referring back to FIG. 4, the second passivation layer 160 is patterned to expose a portion of the first driving electrode 122a and a portion of the first test electrode 152a. A transparent conductive layer is formed on the base mother substrate 210 on which the first driving electrode 122a and the first test electrode 152a are partially exposed. Thereafter, the transparent conductive layer is patterned to form a common electrode CE, a first driving pad electrode 174a, a first test pad electrode 172a and a second electrostatic dispersion line 176b.

The first driving pad electrode 174a is electrically connected with the first driving electrode 122a. The first driving pad electrode 174a is electrically connected with the second electrostatic dispersion line 176b. The first test pad electrode 172a is electrically connected with the first test electrode 152a.

Although not shown, the method of manufacturing a mother substrate 200 for a display substrate may further include a step of forming an alignment layer on the base mother substrate 210 having the patterned transparent electrode layer formed thereon. The alignment layer may be formed through a rubbing process during which a polymer layer including polyimide (PI) is rubbed by a rubbing cloth. Alternatively, the alignment layer may be formed through a printing method during which the base mother substrate 210 may be printed on by a printer having alignment patterns.

During the rubbing process, the mother substrate 200 for a display substrate and the rubbing cloth may be electrified by friction between the mother substrate 200 for a display substrate and the rubbing cloth. During the printing method, the mother substrate 200 for a display substrate and the printer may become electrified by friction between the mother substrate 200 for a display substrate and the printer. Accordingly, electrical charges formed in the rubbing cloth or the printer are discharged into the mother substrate 200 for a display substrate and flow into the mother substrate 200 for a display substrate through the first test pad electrode 172a and the first driving pad electrode 174a. The first electrostatic dispersion line 176a and the second electrostatic dispersion line 176b disperse the charges into the mother substrate 200 for a display substrate by using the shorting bar STB. Accordingly, concentration of the charges on a certain portion of the mother substrate 200 to form static electricity may be prevented.

Then, the mother substrate 200 for a display substrate having the alignment layer formed thereon is combined with a mother substrate (not shown) for a color filter substrate having color filters formed thereon. The mother substrate 200 for the display substrate and the mother substrate for the color filter substrate combined with each other are then cut into unit display cells.

Figure 11:
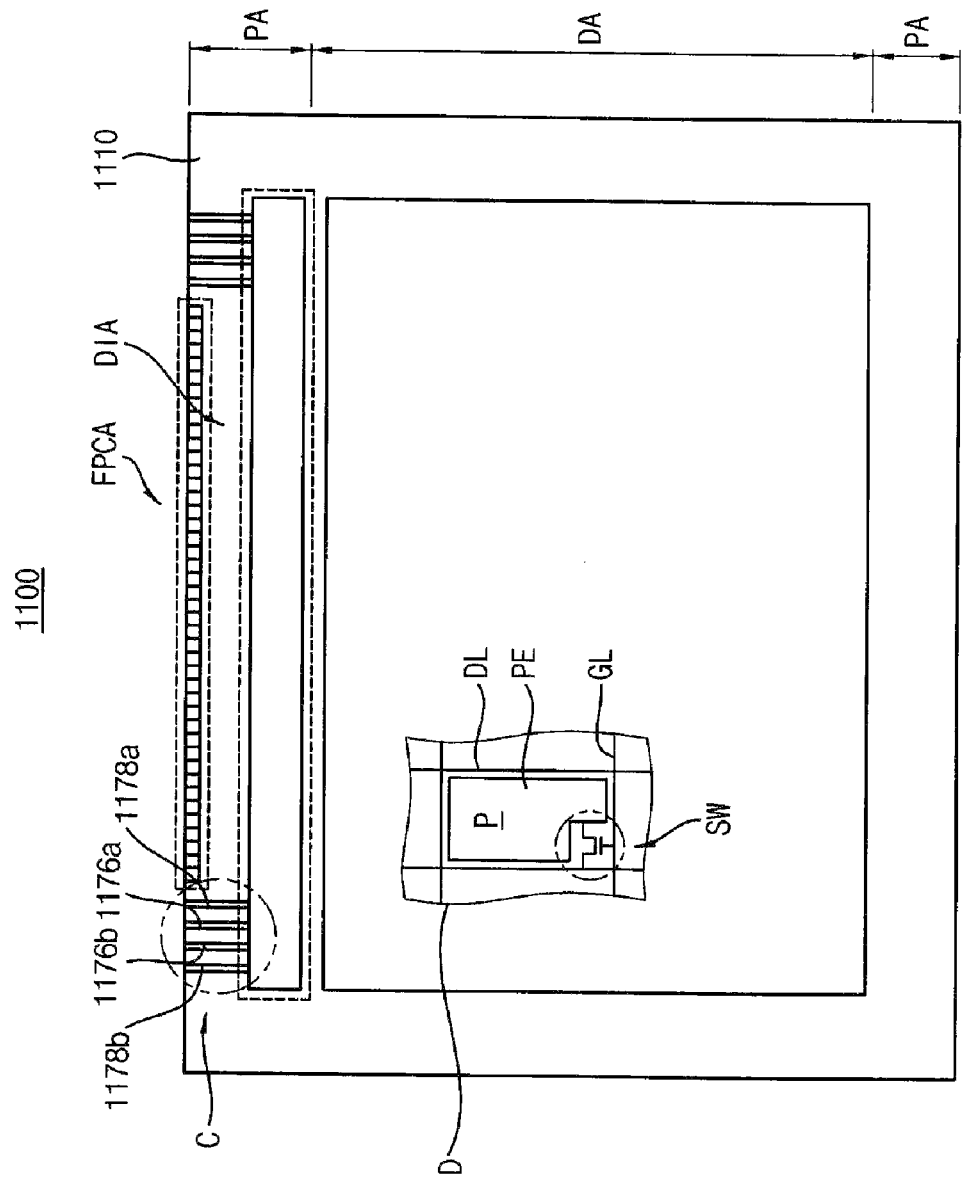
FIG. 11 is a plan view illustrating an exemplary embodiment of a display substrate according to the inventive concept.
Figure 12:
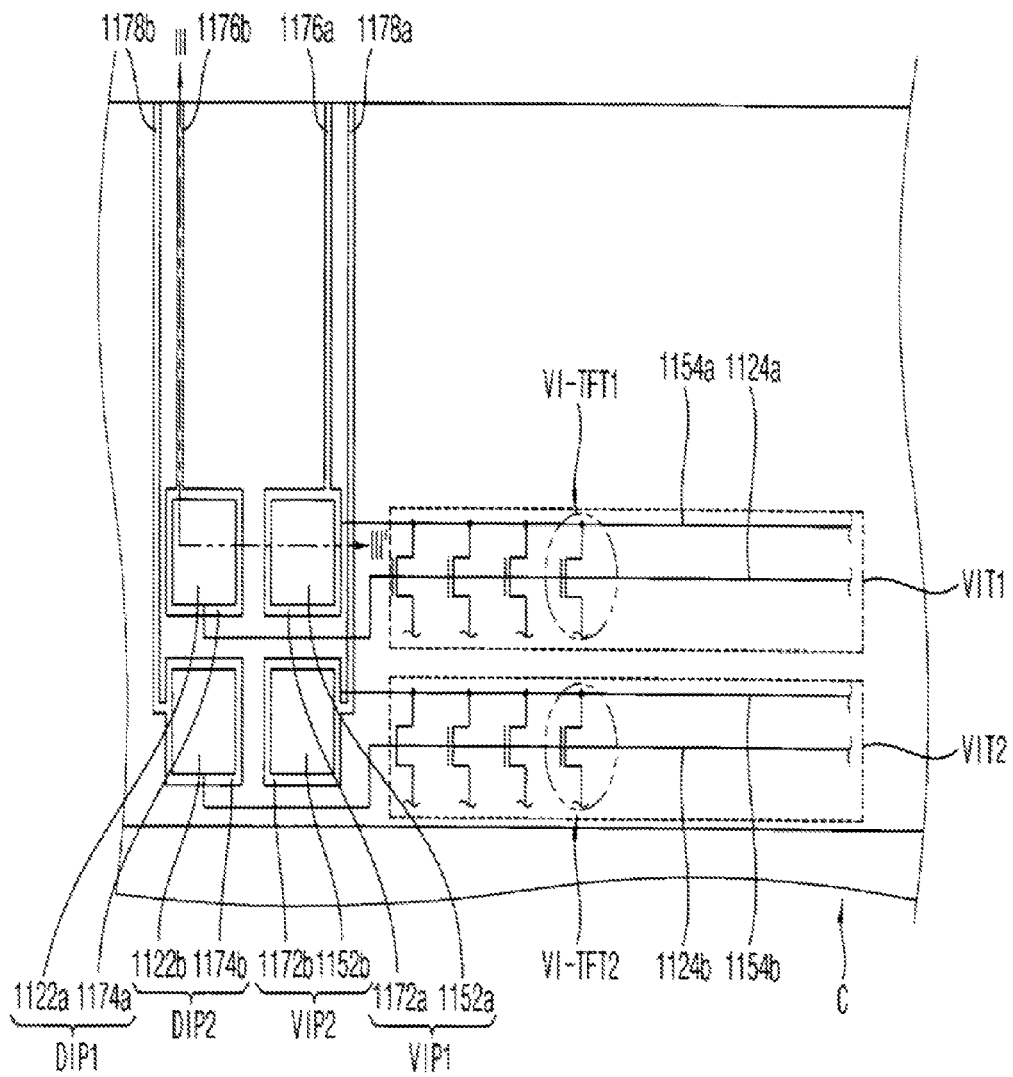
FIG. 12 is a plan view magnifying portion "C" of FIG. 11.
Figure 13:
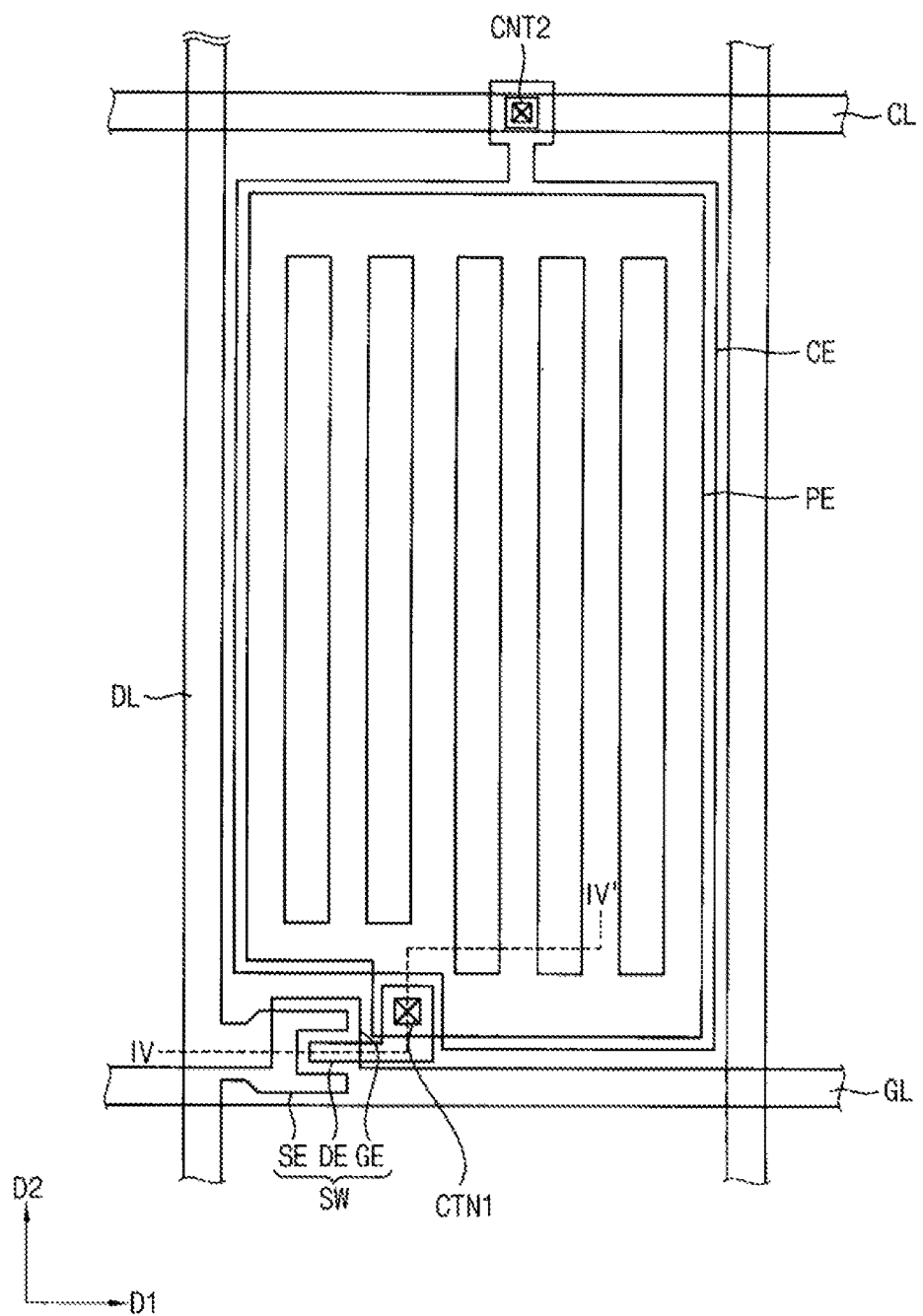
FIG. 13 is a plan view magnifying portion "D" of FIG. 11.
Figure 14:
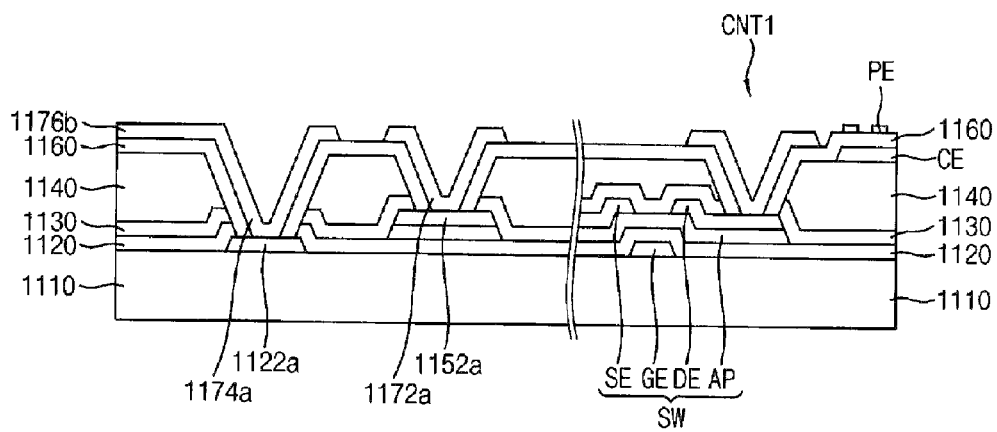
FIG. 14 is a cross-sectional view taken along line III-III' of FIG. 12 and line IV-IV' of FIG. 13.

FIG. 11 is a plan view illustrating an exemplary embodiment of a display substrate according to the inventive concept. FIG. 12 is a plan view magnifying portion "C" of FIG. 11. FIG. 13 is a plan view magnifying portion "D" of FIG. 11. FIG. 14 is a cross-sectional view taken along line III-III' of FIG. 12 and line IV-IV' of FIG. 13.

Referring to FIGS. 11 to 14, a base substrate 1110 of a display substrate 1100 according to an exemplary embodiment of the present inventive concept includes a display area DA including a pixel area P and a peripheral area PA surrounding the display area DA. The peripheral area PA may include a driving chip mounting area DIA and an FPC connection area

FPCA.

A gate line GL, a data line DL, a pixel switching element SW and a pixel electrode PE are formed in the display area DA. The display substrate 1100 includes a base substrate 1110, a gate electrode GE, source electrode SE, a drain electrode DE, an active pattern AP, a pixel electrode PE, a common electrode CE, a gate insulation layer 1120, a first passivation layer 1130, an organic layer 1140 and a second passivation layer 1160.

Examples of the base substrate 1110 may include a glass substrate, a quartz substrate, a silicon substrate, a plastic substrate or the like.

The gate electrode GE is disposed on the base substrate 1110. The gate electrode GE may have a single layer structure including copper (Cu), silver (Ag), chrome (Cr), molybdenum (Mo), aluminum (Al), titanium (Ti), manganese (Mn), or an alloy thereof. According to an embodiment of the present invention, the gate electrode GE may have a multi-layer structure having a plurality of layers that may include materials different each other. For example, the gate electrode GE may include a copper layer and a titanium layer disposed on or under the copper layer.

The gate insulation layer 1120 is formed on the gate electrode GE. The gate insulation layer 1120 may cover the base substrate 1110 and the gate electrode GE. The gate insulation layer 1120 may include inorganic material such as silicon oxide (SiOx) and/or silicon nitride (SiNx). For example, the gate insulation layer 1120 may include silicon oxide (SiOx), and may have a thickness of about 500 Å. In addition, the gate insulation layer 1120 may include a plurality of layers including materials different each other.

An active pattern AP is formed on the gate insulation layer 1120. The active pattern AP is formed on the gate insulation layer 1120 in an area in which the gate electrode GE is formed. The active pattern AP may overlap with the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE.

The source electrode SE and the drain electrode DE may be formed on the active pattern AP. The source electrode SE and the drain electrode DE may be spaced apart from each other. However, the above-described layering is merely exemplary and a person having skill in the art would appreciate alternative or additional layering schemes.

The source electrode SE and the drain electrode DE may have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The first passivation layer 1130 may be formed on the source electrode SE and the drain electrode DE. The first passivation layer 1130 may be formed with a material including silicon oxide (SiOx) or silicon nitride (SiNx).

The organic layer 1140 is formed on the first passivation layer 1130. The organic layer 1140 planarizes an upper surface of the display substrate 1100, so that problems due to the step such as disconnection of a signal line may be prevented.

The common electrode CE is formed on the organic layer 1140. The common electrode CE may include a transparent conductive material, such as indium tin oxide (ITO), indium zinc oxide (IZO), etc. In addition, the common electrode CE may include titanium (Ti) and/or molybdenum titanium (MoTi). The common electrode CE may be electrically connected with a common line CL. The common electrode CE may be electrically connected with the common line CL through a second contact hole CNT2.

The second passivation layer 1160 may be formed on the common electrode CE.

The second passivation layer 1160 may be formed with a material including silicon oxide (SiOx) or silicon nitride (SiNx).

The pixel electrode PE may be formed on the second passivation layer 1160. The pixel electrode PE may overlap the common electrode CE. The pixel electrode PE may include a transparent conductive material, such as indium tin oxide (ITO), indium zinc oxide (IZO) and etc. Additionally or alternatively, the pixel electrode PE may include titanium (Ti) and/or molybdenum titanium (MoTi). The pixel electrode PE may be electrically connected with the drain electrode DE through the first contact hole CNT1.

IC pads (not shown) electrically connected with a driving chip (not shown), a test switching portion (not shown) for performing a VI process, a test signal line (not shown) connected with the test switching portion, and a driving signal line (not shown) may be formed in the driving chip mounting area DIA. FPC pads (not shown) electrically connected with metal terminals of a flexible printed circuit board (not shown) may be formed in the FPC connection area FPCA. First electrostatic dispersion lines 1176a and 1178a and second electrostatic lines 1176b and 1178b are formed in the peripheral area PA. The first electrostatic dispersion lines 1176a and 1178a extend from the driving chip mounting area DIA to an end of the base substrate 1110. The second electrostatic dispersion lines 1176b and 1178b are substantially parallel with the first electrostatic lines 1176a and 1178a and extend to the end of the base substrate 1110.

The first and second electrostatic dispersion lines 1176a, 1178a, 1176b, and 1178b are connected with a shorting bar (not shown) formed on a mother substrate for a display substrate. The first and second electrostatic dispersion lines 1176a, 1178a, 1176b, and 1178b may be separated from the shorting bar to remain in the display substrate by a process of cutting the mother substrate. Third electrostatic dispersion lines (not shown) connected with the FPC pads may be formed in the FPC connection area FPCA. The third electrostatic dispersion lines may be connected with the shorting bar with the first and second electrostatic dispersion lines 1176a, 1178a, 1176b, and 1178b. The third electrostatic dispersion lines may be separated from the shorting bar to remain in the display substrate by the process of cutting the mother substrate. The first electrostatic dispersion lines 1176a and 1178a, the second electrostatic dispersion lines 1176b and 1178b, and the pixel electrode PE may be formed from a same layer.

A first test switching portion VIT1, a second test switching portion VIT2, a first test signal line 1154a, a second test signal line 1154b, a first driving signal line 1124a, a second driving signal line 1124b, a first test pad portion VIP1, a second test pad portion VIP2, a first driving pad portion DIP 1, and a second driving pad portion DIP2 are formed in the driving chip mounting area DIA. The first electrostatic dispersion lines 1176a and 1178a are respectively connected with the first test pad portion VIP1 and the second test pad portion VIP2. The second electrostatic dispersion lines 1176b and 1178b are respectively connected with the first driving pad portion DIPJ and the second driving pad portion DIP2.

The first test switching portion VIT1 includes first test switching elements VI-TFT1 connected with the first test signal line 1154a and the first driving signal line 1124a. The second test switching portion VIT2 includes second test switching elements VI-TFT2 connected with the second test signal line 1154b and the second driving signal line 1124b. The first test switching element VI-TFT1 includes a gate electrode, a source electrode formed on the gate electrode and a drain electrode formed on the gate electrode.

The first test pad portion VIP1 is connected with an end of the first test signal line 1154a. The first test pad portion VIP1 includes a first test electrode 1152a and a first test pad electrode 1172a. The first test electrode 1152a is connected with the first test signal line 1154a.

The test pad electrode 1172a is electrically connected with the first test electrode 1152a. The first test pad electrode 1172a is connected with the first electrostatic dispersion lines 1176a. The second test pad portion VIP2 is connected with an end of the second test signal line 1154b. The second test pad portion VIP2 includes a second test electrode 1152b and a second test pad electrode 1172b. The second test electrode 1152b is connected with the second test signal line 1154b. The second test pad electrode 1172b is electrically connected with the second test electrode 1152b. The second test pad electrode 1172b is connected with the first electrostatic dispersion lines 1178a.

The first driving pad portion DIP1 is connected with an end of the first driving signal line 1124a. The first driving pad portion DIP1 includes a first driving electrode 1122a and a first driving pad electrode 1174a. The first driving electrode 1122a is connected with the first driving signal line 1124a. The first driving pad electrode 1174a is electrically connected with the first driving electrode 1122a. The first driving pad electrode 1174a is connected with the second electrostatic dispersion lines 1176b. The second driving pad portion DIP2 is connected with an end of the second driving signal line 1124b. The second driving pad portion DIP2 includes a second driving electrode 1122b and a second driving pad electrode 1174b. The second driving electrode 1122b is connected with the second driving signal line 1124b. The second driving pad electrode 1174b is electrically connected with the second driving electrode 1122b. The second driving pad electrode 1174b is connected with the second electrostatic dispersion lines 1178a.

Figure 15:
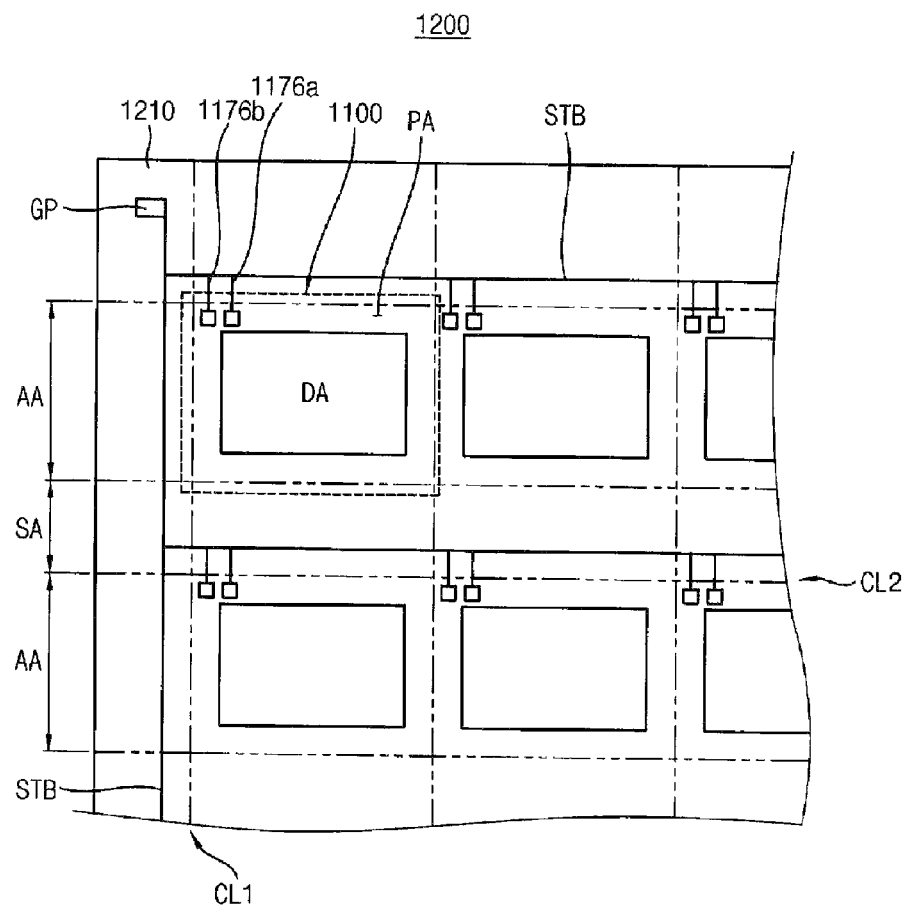
FIG. 15 is a plan view illustrating an exemplary embodiment of a mother substrate according to the inventive concept.

FIG. 15 is a plan view illustrating an exemplary embodiment of a mother substrate according to the inventive concept.

Referring to FIG. 15, a mother substrate 1200 for a display substrate includes a base mother substrate 1210. The base mother substrate 1210 includes a plurality of array areas AA and a plurality of outer areas SA. An array layer is formed in the array area AA. The outer area SA is formed between adjacent array areas AA. An array layer is formed in the array area AA. The outer area SA is formed between adjacent array areas AA. Each of the array areas AA includes at least one display area DA and at least one peripheral area PA. An image is displayed in the display area DA. The peripheral area PA surrounds the display area DA. The array layer may include a gate line (not shown), a data line, test signal lines, and driving signal lines. The gate line and the data line may be formed in the display area DA. The data line may cross with the gate line. The display area DA includes a plurality of pixel regions. The test signal lines and the driving signal lines may be formed in the peripheral area PA.

The base mother substrate 1210 includes a shorting bar STB and a ground electrode GP. The shorting bar STB surrounds each of the array areas AA. The ground electrode GP is electrically connected with the shorting bar STB. The shorting bar STB is respectively connected with the first test electrode 1152a and the first driving electrode 1122a through the first electrostatic dispersion lines 1176a and the second electrostatic dispersion lines 1176b. The ground electrode GP may diffuse an electric charge generated during a manufacturing process to the mother substrate 1200. The ground electrode GP may be disposed in the outer area SA. The ground electrode GP may be formed as a size of 5 mm×5 mm. However, these are merely exemplary, and a person having skill in the art would appreciate alternative positions and sizes for ground electrode GP.

The base mother substrate 1210 is cut to form a plurality of display substrates 1100 corresponding to the array areas AA through a process of cutting the base mother substrate by an array area AA. The base mother substrate 1210 includes a first cutting line CL1 and a second cutting line CL2. The first cutting line CL1 extends in the first direction. The second cutting line CL2 is extending in a second direction substantially perpendicular to the first direction. The mother substrate 1200 for a display substrate is cut along the first and second cutting lines CL1 and CL2, which are virtual lines.

FIGS. 16 to 20 are cross-sectional views illustrating an exemplary embodiment of a method of manufacturing the display substrate of FIG. 14.

Figure 16:
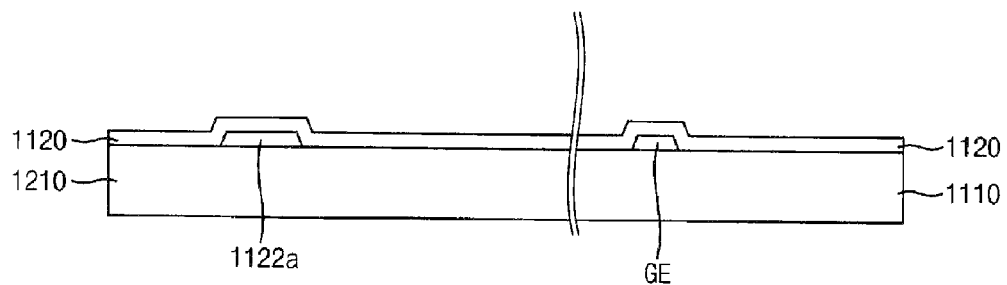
FIGS. 16, 17, 18, 19, and 20 are cross-sectional views illustrating an exemplary embodiment of a method of manufacturing the display substrate of FIG. 14.

Referring to FIG. 16, a gate electrode GE, a first driving electrode 1122a and a gate insulation layer 1120 are formed on a base mother substrate 1210.

Examples of the base mother substrate 1210 may include a glass substrate, a quartz substrate, a silicon substrate, a plastic substrate or the like. The gate electrode GE and the first driving electrode 1122a may have a single layer structure including copper (Cu), silver (Ag), chrome (Cr), molybdenum (Mo), aluminum (Al), titanium (Ti), manganese (Mn) and/or a mixture thereof. Additionally or alternatively, the first conductive layer may have a multi layer structure having a plurality of layers including materials different each other.

The gate insulation layer 1120 may be formed on the base mother substrate 1210 on which the gate electrode GE and the first driving electrode 1122a are formed. The gate insulation layer 1120 may include inorganic material such as silicon oxide (SiOx) and/or silicon nitride (SiNx).

Figure 17:
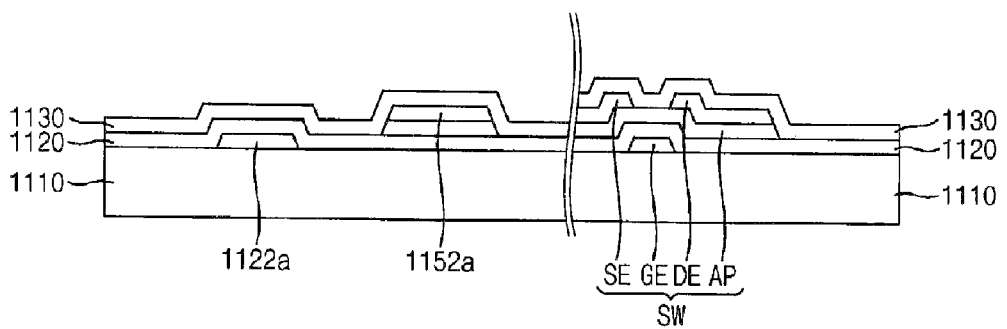

Referring to FIG. 17, an active pattern AP, a source electrode SE, a drain electrode DE, a first test electrode 1152a and a first passivation layer 1130 are formed on the base mother substrate 1210 on which the first driving electrode 1122a is formed.

The active pattern AP is formed on the gate insulation layer 1120. The active pattern AP is formed on the gate insulation layer 1120 in an area in which the gate electrode GE is formed. The active pattern AP may overlap the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE. The source electrode SE and the drain electrode DE may have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The first passivation layer 1130 may include the same material as the gate insulation layer 1120. For example, the first passivation layer 1130 may be formed with a material including silicon oxide (SiOx) or silicon nitride (SiNx).

Figure 18:
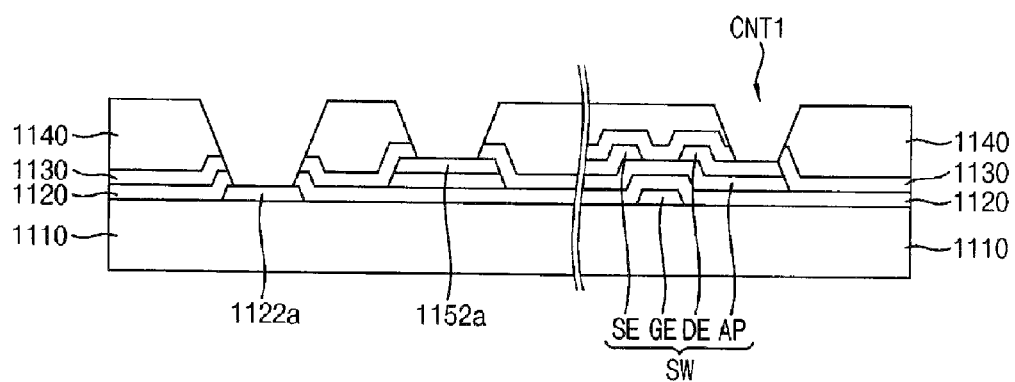

Referring to FIG. 18, an organic layer 1140 is formed on the base mother substrate 1210 on which the first passivation layer 1130 is formed. The organic layer 1140 planarizes an upper surface of the display substrate, so that problems due to the step such as disconnection of a signal line may be prevented.

Thereafter, the organic layer 1140 is patterned to form a first contact hole CNT1. In addition, the organic layer 1140, the first passivation layer 1130 and the gate insulation layer 1120 are patterned to expose a portion of the first driving electrode 1122a. The organic layer 1140 and the first passivation layer 1130 are patterned to expose a portion of the first test electrode 1152a.

Figure 19:
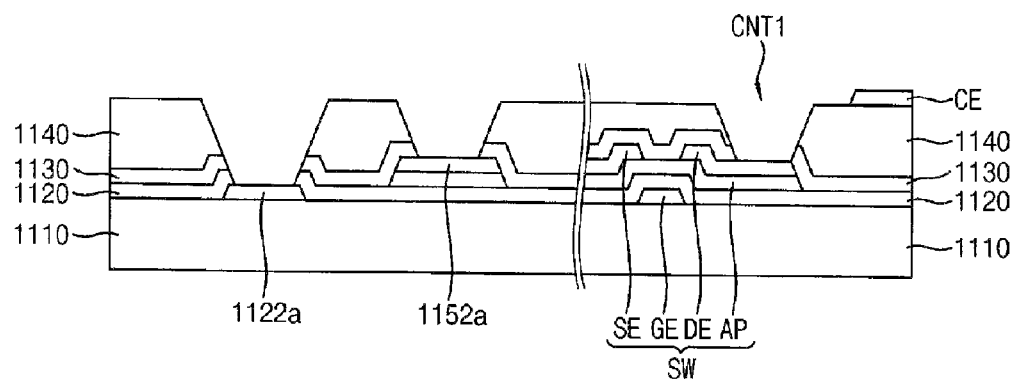

Referring to FIG. 19, a common electrode CE is formed on the base mother substrate 1210 on which the first contact hole CNT1 is formed.

The common electrode CE may include a transparent conductive material, such as indium tin oxide (ITO), indium zinc oxide (IZO), etc. In addition, the common electrode CE may include titanium (Ti) and/or molybdenum titanium (MoTi).

Figure 20:
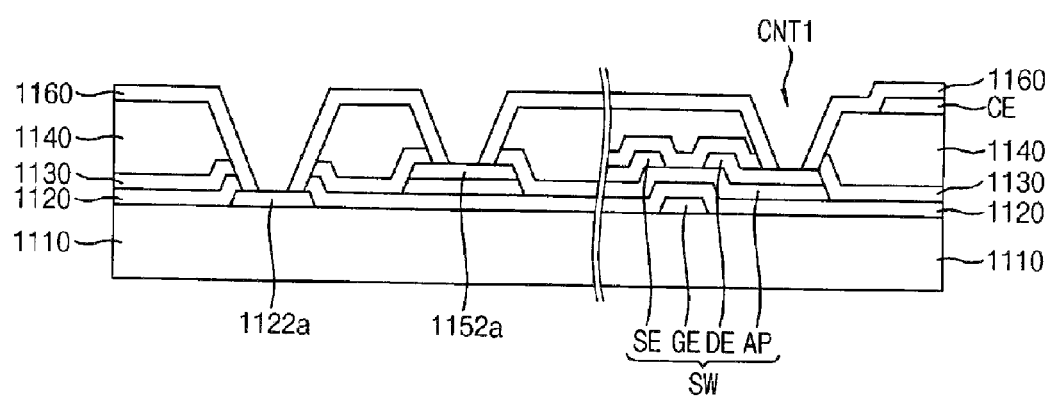

Referring to FIG. 20, a second passivation layer 1160 is formed on the base mother substrate 210 on which the common electrode CE is formed. The second passivation layer 1160 may include the same material as the first passivation layer 1130. For example, the second passivation layer 1160 may be formed with a material including silicon oxide (SiOx) or silicon nitride (SiNx).

Thereafter, and referring back to FIG. 14, the second passivation layer 1160 is patterned to expose a portion of the first driving electrode 1122a and a portion of the first test electrode 1152a. A transparent conductive layer is formed on the base mother substrate 1210 on which the first driving electrode 1122a and the first test electrode 1152a are partially exposed. Thereafter, the transparent conductive layer is patterned to form a common electrode CE, a first driving pad electrode 1174a, a first test pad electrode 1172a and a second electrostatic dispersion line 1176b.

The first driving pad electrode 1174a is electrically connected with the first driving electrode 1122a. The first driving pad electrode 1174a is electrically connected with the second electrostatic dispersion line 1176b. The first test pad electrode 1172a is electrically connected with the first test electrode 1152a.

Although not shown, the method of manufacturing a mother substrate 1200 for a display substrate may further include a step of forming an alignment layer on the base mother substrate 1210 having the patterned transparent electrode layer formed thereon. The alignment layer may be formed through a rubbing process during which a polymer layer including polyimide (PI) is rubbed by a rubbing cloth. Alternatively, the alignment layer may be formed through a printing method during which the base mother substrate 1210 may be printed on by a printer having alignment patterns.

During the rubbing process, the mother substrate 1200 for a display substrate and the rubbing cloth may be electrified by friction between the mother substrate 1200 for a display substrate and the rubbing cloth. During the printing method, the mother substrate 1200 for a display substrate and the printer may become electrified by friction between the mother substrate 1200 for a display substrate and the printer. Accordingly, electrical charges formed in the rubbing cloth or the printer are discharged into the mother substrate 1200 for a display substrate and flow into the mother substrate 1200 for a display substrate through the first test pad electrode 1172a and the first driving pad electrode 1174a. The first electrostatic dispersion line 1176a and the second electrostatic dispersion line 1176b disperse the charges into the mother substrate 1200 for a display substrate by using the shorting bar STB. Accordingly, concentration of the charges on a certain portion of the mother substrate 1200 to form static electricity may be prevented.

Then, the mother substrate 1200 for a display substrate having the alignment layer formed thereon is combined with a mother substrate (not shown) for a color filter substrate having color filters formed thereon. The mother substrate 200 for the display substrate and the mother substrate for the color filter substrate combined with each other are then cut into unit display cells.

According to the exemplary embodiments of the present inventive concept as explained above, a pad portion and a shorting bar are electrically connected with each other through electrostatic dispersion lines. Thus, charges flowing through the pad portion may be dispersed into the overall mother substrate for a display substrate by using the shorting bar.

Therefore, concentration of the charges on a portion of the mother substrate may be prevented. Thus, static electricity may be prevented or reduced.

In addition, a ground electrode connected with the shorting bar is formed, so that charges generated in a manufacturing process to the mother substrate may be dispersed immediately. Thus, damages due to the static electricity may be prevented and a reliability of product and manufacturing process may be improved.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display substrate, comprising:
a pixel portion comprising a switching element, a pixel electrode, and a common electrode, the switching element disposed in a display area of a substrate, the switching element electrically connected with a gate line and a data line, the pixel electrode disposed adjacent to the switching element and disposed directly on a drain electrode of the switching element, the common electrode disposed on the pixel electrode to overlap the pixel electrode;
a test pad portion disposed adjacent to the display area, the test pad portion being electrically connected with the pixel portion and configured to apply a test signal;
a first electrostatic dispersion line extending to an end of the substrate;
a first passivation layer disposed on the switching element;
an organic layer disposed on the first passivation layer; and
a second passivation layer disposed on the organic layer, wherein:
the common electrode has a plurality of slits,
the pixel electrode is disposed between the organic layer and the second passivation layer,
the second passivation layer is disposed between the common electrode and the pixel electrode,
the second passivation layer is disposed between the first electrostatic dispersion line and the organic layer, and
the first electrostatic dispersion line and the common electrode are formed from a same layer comprising a transparent conductive material.

2. The display substrate of claim 1, further comprising:
a test switching portion electrically connected with the test pad portion and configured to apply a test signal to the gate line or the data line; and
a test signal line extending from the test pad portion, the test signal line electrically connected with the test switching portion to apply a test signal to the test switching portion.

3. The display substrate of claim 2, wherein the test pad portion comprises:
a test electrode electrically connected with the test signal line; and
a test pad electrode electrically connected with the test electrode.

4. The display substrate of claim 3, wherein the first electrostatic dispersion line and the test pad electrode are formed from a same layer to be electrically connected with each other.

5. The display substrate of claim 2, further comprising:
a driving signal line electrically connected with the test switching portion and configured to apply a driving signal to the test switching portion;
a driving pad portion disposed on an end of the driving signal line and configured to receive the driving signal; and
a second electrostatic dispersion line extending from the driving pad portion to an end of the substrate.

6. The display substrate of claim 5, wherein the driving pad portion comprises:
a driving electrode electrically connected with the driving signal line; and
a driving pad electrode electrically connected with the driving electrode.

7. The display substrate of claim 6, wherein the second electrostatic dispersion line and the driving pad electrode are formed from a same layer to be electrically connected with each other.

8. The display substrate of claim 7, wherein the second electrostatic dispersion line and the first electrostatic dispersion line are formed from a same layer and the second electrostatic dispersion line and the first electrostatic dispersion line are spaced apart from each other.

9. The display substrate of claim 1, wherein the switching element comprises:
a gate electrode electrically connected with the gate line;
an active pattern overlapping the gate electrode;
a source electrode overlapping the active pattern and electrically connected with the data line; and
the drain electrode overlapping the active pattern and spaced apart from the source electrode.

* * * * *